United States Patent [19]
Matsumoto et al.

[11] Patent Number: 6,023,484
[45] Date of Patent: *Feb. 8, 2000

[54] SEMICONDUCTOR LASER DEVICE

[75] Inventors: Mitsuhiro Matsumoto, Kashihara; Takahiro Suyama, Yamatokoriyama, both of Japan

[73] Assignee: Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/694,594

[22] Filed: Aug. 9, 1996

[30] Foreign Application Priority Data

Aug. 11, 1995 [JP] Japan ................................ 7-206363

[51] Int. Cl.⁷ ........................................... H01S 3/19
[52] U.S. Cl. ................................ 372/46; 372/45
[58] Field of Search ................... 372/46, 45, 50

[56] References Cited

U.S. PATENT DOCUMENTS

| | | | |
|---|---|---|---|
| 5,065,402 | 11/1991 | Kawano | 372/45 |
| 5,161,167 | 11/1992 | Murakami et al. | 372/45 |
| 5,185,755 | 2/1993 | Mori et al. | 372/45 |
| 5,359,619 | 10/1994 | Yoshida et al. | 372/50 |
| 5,488,233 | 1/1996 | Ishikawa et al. | 372/45 |
| 5,604,764 | 2/1997 | Motoda et al. | 372/45 |

FOREIGN PATENT DOCUMENTS 5-21902  1/1993  Japan .

OTHER PUBLICATIONS

Fujii et al., "Zn diffusion mechanism in n–GaAs/Zn–AlGaAs/Se–AlGaAs structures" 7th International Conference on Metalorganic Vapor Phase Epitaxy VII (May 31–Jun. 3, 1994), Yokohama, Japan, pp. 210–211.

Neave et al., "Silicon doping of MBE–grown GaAs films" *Appl. Phys. A* (1983) 32:195–200. (No Month Available).

Horii et al., "High–power AlGaAs/GaAs semiconductor lasers grown by MOCVD" *Optoelectronics–Devices and Technologies* (1986) 1(1):57–65. (Jun.).

*Primary Examiner*—Hemang Sanghavi
*Attorney, Agent, or Firm*—Morrison & Foerster LLP

[57] ABSTRACT

The semiconductor laser device of the invention includes: an n-type semiconductor and a semiconductor multi-layer structure formed on the n-type semiconductor. The semiconductor multi-layer structure includes: an active layer; an n-type first cladding layer and a p-type second cladding layer which are disposed so as to sandwich the active layer therebetween; an n-type current/light confinement layer having a stripe-shaped groove portion for injecting a current into a selected region of the active layer; and a p-type third cladding layer formed so as to bury the stripe-shaped groove portion of the n-type current/light confinement layer. In the semiconductor laser device, the current/light confinement layer contains Si as a dopant and the n-type first cladding layer contains substantially no Si as a dopant.

14 Claims, 5 Drawing Sheets

Thickness of p-type second
cladding layer other than stripe (μm)

SEMICONDUCTOR LASER DEVICE

BACKGROUND OF THE INVENTION

1. Field of the Invention:

The present invention relates to a semiconductor laser device usable for an optical disk and the like.

Figure 8:
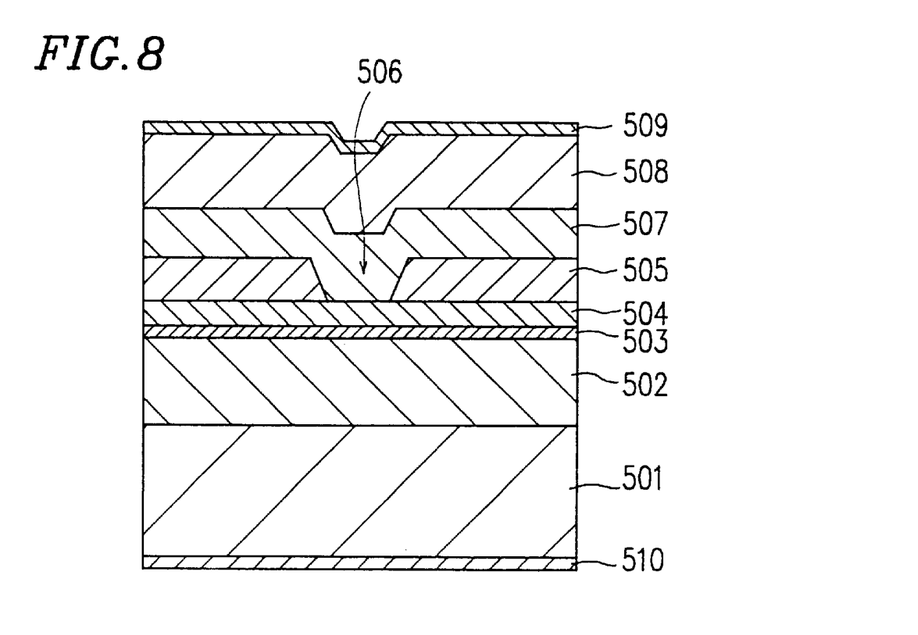
FIG. 8 is a cross-sectional view of a conventional semiconductor laser device.

2. Description of the Related Art:

In conventional semiconductor laser devices, a buried heterostructure such as that shown in FIG. 8 has been utilized for improving current/light confinement efficiently in a lateral direction (or a direction parallel to the surface of the substrate). A conventional semiconductor laser device of this type (hereinafter, such a device will be referred to as a "conventional semiconductor laser device (I)") will be briefly described with reference to FIG. 8. In this conventional semiconductor laser device (I), an n-type $Al_{0.5}Ga_{0.5}As$ first cladding layer 502 (carrier density: $3 \times 10^{18}$ $cm^{-3}$; dopant: Se); an undoped active layer 503; a p-type $Al_{0.5}Ga_{0.5}As$ second cladding layer 504 (carrier density: $5 \times 10^{17}$ $cm^{-3}$; dopant: Zn); and an n-type GaAs current/light confinement layer 505 (carrier density: $3 \times 10^{18}$ $cm^{-3}$; dopant: Se) are sequentially grown on an n-type GaAs semiconductor substrate 501 by performing a first metalorganic chemical vapor deposition (MOCVD) process. A stripe-shaped groove 506 is formed in the n-type current/light confinement layer 505 so as to reach the p-type second cladding layer 504. Then, by performing a second MOCVD process, a p-type $Al_{0.5}Ga_{0.5}As$ third cladding layer 507 (carrier density: $1 \times 10^{18}$ $cm^{-3}$; dopant: Zn) and a p-type GaAs contact layer 508 (carrier density: $3 \times 10^{18}$ $cm^{-3}$; dopant: Zn) are formed thereon so as to bury the groove 506. In such a conventional semiconductor laser device (I), Se is generally used as an n-type dopant and Zn is generally used as a p-type dopant. In addition, in order to effectively confine current and light, the film thickness of the p-type second cladding layer 504 is set in an approximate range from 0.05 to 0.6 $\mu$m.

On the other hand, Fujii et al. reported another type of semiconductor laser device in ICMOVPE VII conference (1994). Fujii's semiconductor laser device will be referred to as a conventional semiconductor laser device (II). In the conventional semiconductor laser device (II), first, an n-type $Al_{0.5}Ga_{0.5}As$ layer (carrier density: $1 \times 10^{18}$ $cm^{-3}$; dopant: Se); a p-type $Al_{0.5}Ga_{0.5}As$ layer (carrier density: $1 \times 10^{18}$ $cm^{-3}$; dopant: Zn; film thickness: 1.25 $\mu$m) and an n-type GaAs layer are sequentially grown on an n-type GaAs substrate by performing an MOCVD process. In the case of using Se as a dopant for the n-type GaAs layer, when the carrier density of Se becomes $4 \times 10^{18}$ $cm^{-3}$ or more, a larger amount of Zn diffuses from the p-type $Al_{0.5}Ga_{0.5}As$ layer to the n-type $Al_{0.5}Ga_{0.5}As$ layer and the n-type GaAs layer. However, in the case of using Si as a dopant for the n-type GaAs layer, even when the carrier density of Si reaches $4 \times 10^{18}$ $cm^{-3}$, the diffusion amount of Zn is relatively small, and when the carrier density of Si becomes $6 \times 10^{18}$ $cm^{-3}$ or more, the diffusion amount of Zn is increased in the same way as in the case of Se.

Furthermore, Neave et al. reported still another type of semiconductor laser device in Appl. Phys. A32 (1983) 195. Neave's semiconductor laser device will be referred to as a conventional semiconductor laser device (III). In the conventional semiconductor laser device (III), in the case of using Si as an n-type dopant, when the carrier density of Si becomes $3 \times 10^{18}$ $cm^{-3}$ or more, the light-emission efficiency is abruptly decreased.

However, the conventional semiconductor laser devices (I) to (III) described above have the following problems.

In the conventional semiconductor laser device (I), an n-type first cladding layer 502; an active layer 503; a p-type second cladding layer 504; and an n-type current/light confinement layer 505 are sequentially grown on an n-type GaAs substrate 501 by performing a first MOCVD process. In this case, Zn contained as a dopant in the p-type second cladding layer 504 diffuses to both of the n-type first cladding layer 502 on the lower side and the n-type current/light confinement layer 505 on the upper side which sandwich the p-type second cladding layer 504 therebetween, so that the carrier density of Zn in the p-type second cladding layer 504 is decreased. As a result, the barrier of the p-type second cladding layer 504 with respect to the carriers injected into the active layer 503 becomes lower, so that the carriers leak into the p-type second cladding layer 504. Such a carrier leakage becomes remarkable when the semiconductor laser device operates at a high temperature. Thus, the characteristics of such a semiconductor laser device operating at a high temperature are adversely deteriorated.

On the other hand, in the conventional semiconductor laser device (II), in the case of sequentially depositing an n-type AlGaAs layer, a p-type AlGaAs layer and an n-type GaAs layer on an n-type GaAs substrate by performing an MOCVD process, if Si is used as a dopant for the n-type GaAs layer, then Zn or a dopant for the p-type AlGaAs layer diffuses less than the case of using Se as a dopant for the n-type GaAs layer as disclosed by Fujii et al. However, this multi-layer structure is different from a common semiconductor laser device structure in that a layer corresponding to an active layer for a common semiconductor laser device is not provided between the n-type AlGaAs layer and the p-type AlGaAs layer in the conventional semiconductor laser device (II). Moreover, the film thickness of the p-type AlGaAs layer is 1.25 $\mu$m, which is far larger than a typical film thickness (in an approximate range from 0.05 $\mu$m to 0.6 $\mu$m) of a second cladding layer in a semiconductor laser device structure. Furthermore, the carrier density of the p-type AlGaAs layer is unclear. Therefore, it is not clear how Zn diffuses when this structure is applied to a semiconductor laser device structure.

Furthermore, in the conventional semiconductor laser device (III), when high-density Si is doped as an n-type dopant, the light-emission efficiency is degraded as reported by Neave et al. Therefore, in the case of using Si as a dopant for the n-type cladding layer adjacent to the active layer for improving the characteristics of a semiconductor laser device operating at a high temperature, Si diffuses into the active layer, so that Si disadvantageously degrades the light emission efficiency inside the active layer.

SUMMARY OF THE INVENTION

According to the present invention, a semiconductor laser device is provided. The semiconductor laser device includes: an n-type semiconductor and a semiconductor multi-layer structure formed on the n-type semiconductor. The semiconductor multi-layer structure includes: an active layer; an n-type first cladding layer and a p-type second cladding layer which are disposed so as to sandwich the active layer therebetween; an n-type current/light confinement layer having a stripe-shaped groove portion for injecting a current into a selected region of the active layer; and a p-type third cladding layer formed so as to bury the stripe-shaped groove portion of the n-type current/light confinement layer. In the semiconductor laser device, the current/light confinement layer contains Si as a dopant and the n-type first cladding layer contains substantially no Si as a dopant.

According to another aspect of the present invention, a semiconductor laser device is provided. The semiconductor laser device includes: an n-type semiconductor and a semiconductor multi-layer structure formed on the n-type semiconductor. The semiconductor multi-layer structure includes: an active layer; an n-type first cladding layer and a p-type second cladding layer which are disposed so as to sandwich the active layer therebetween; a p-type third cladding layer in a ridge stripe shape which is formed on the p-type second cladding layer; and an n-type current/light confinement layer formed so as to sandwich both sides of the p-type third cladding layer in a ridge stripe. In the semiconductor laser device, the current/light confinement layer contains Si as a dopant and the n-type first cladding layer contains substantially no Si as a dopant.

In one embodiment, a thickness of the second cladding layer is in an approximate range from 0.05 μm to 0.6 μm, both inclusive.

In another embodiment, a band gap of the current/light confinement layer is equal to or smaller than a band gap of the active layer and a carrier density of the current/light confinement layer is in an approximate range from $1 \times 10^{18}$ cm$^{-3}$ to $5 \times 10^{18}$ cm$^{-3}$, both inclusive.

In still another embodiment, a band gap of the current/light confinement layer is larger than a band gap of the active layer and a carrier density of the current/light confinement layer is in an approximate range from $1 \times 10^{17}$ cm$^{-3}$ to $5 \times 10^{18}$ cm$^{-3}$, both inclusive.

In still another embodiment, a dopant of the first cladding layer is a Group VI atom.

In still another embodiment, at least one etch stop layer is disposed under the current/light confinement layer.

Hereinafter, the functions or the effects attained by the present invention will be described.

According to the present invention, an n-type current/light confinement layer contains Si as a dopant. Therefore, when an n-type first cladding layer, an active layer, a p-type second cladding layer and an n-type current/light confinement layer are sequentially grown on an n-type GaAs substrate, it is possible to prevent a dopant (e.g., Zn) for the p-type second cladding layer from diffusing.

In addition, since Si is not contained as a dopant in the n-type first cladding layer adjacent to the active layer, even if the dopant atoms diffuse from the n-type first cladding layer to the active layer, the light emission efficiency is not degraded.

When the thickness of the p-type second cladding layer is set in an approximate range from 0.05 μm to 0.6 μm, both inclusive, current and light can be efficiently confined.

In the case where the band gap of the n-type current/light confinement layer is set to be equal to or smaller than the band gap of the active layer and the carrier density of the current/light confinement layer is set in an approximate range from $1 \times 10^{18}$ cm$^{-3}$ to $5 \times 10^{18}$ cm$^{-3}$, both inclusive, or in the case where the band gap of the n-type current/light confinement layer is set to be larger than the band gap of the active layer and the carrier density of the current/light confinement layer is set in an approximate range from $1 \times 10^{17}$ cm$^{-3}$ to $5 \times 10^{18}$ cm$^{-3}$, both inclusive, not only current and light can be sufficiently confined but also the carrier density of the p-type second cladding layer can be made sufficiently high.

If a Group VI atom such as Se, S or Te is used as a dopant for the first cladding layer, the light emission efficiency is not degraded, so that it is possible to prevent the device characteristics from being deteriorated.

Thus, the invention described herein makes possible the advantage of providing a semiconductor laser device which can improve the characteristics of the device operating at a high temperature and can prevent the light emission efficiency from being degraded.

This and other advantages of the present invention will become apparent to those skilled in the art upon reading and understanding the following detailed description with reference to the accompanying figures.

DESCRIPTION OF THE PREFERRED EMBODIMENTS

Hereinafter, the embodiments of the present invention will be described with reference to the accompanying drawings.

EXAMPLE 1

Figure 1:
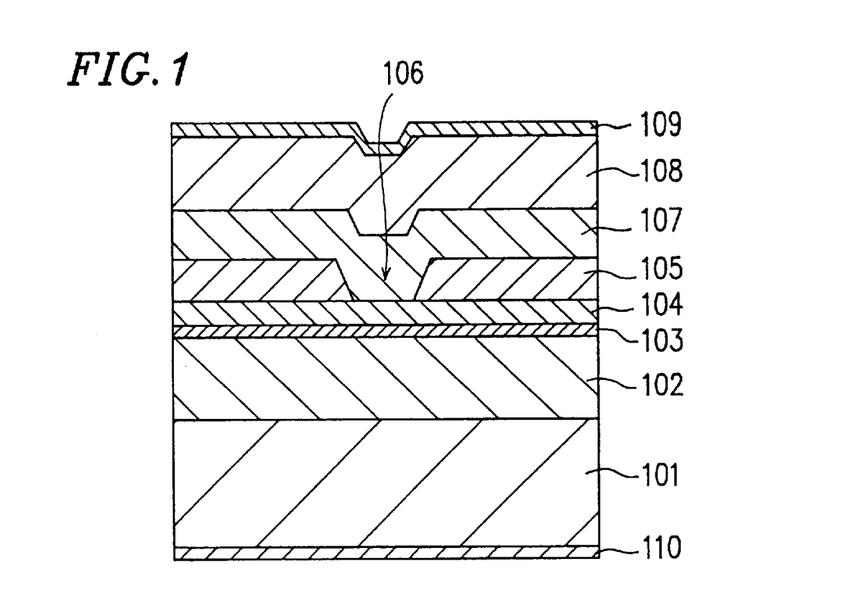
FIG. 1 is a cross-sectional view of a semiconductor laser device in a first example of the present invention.

FIG. 1 is a cross-sectional view of a semiconductor laser device in a first example of the present invention.

As shown in FIG. 1, in this semiconductor laser device, an n-type $Al_{0.5}Ga_{0.5}As$ first cladding layer 102 (film thickness: 1.0 μm; carrier density: $1 \times 10^{18}$ cm$^{-3}$; dopant: Se); an undoped $Al_{0.14}Ga_{0.86}As$ active layer 103 (film thickness: 0.08 μm); a p-type $Al_{0.5}Ga_{0.5}As$ second cladding layer 104 (film thickness: 0.3 μm; dopant: Zn); and an n-type GaAs current/light confinement layer 105 (film thickness: 0.6 μm; carrier density: $3 \times 10^{18}$ cm$^{-3}$; dopant: Si) are sequentially grown on an n-type GaAs substrate 101.

A stripe-shaped groove 106 is formed in the center portion of the n-type current/light confinement layer 105 so as to reach the p-type second cladding layer 104. A p-type $Al_{0.5}Ga_{0.5}As$ third cladding layer 107 (film thickness: 1.5 μm) is formed so as to bury the groove 106, and a p-type GaAs contact layer 108 (film thickness: 1.5 μm) is formed thereon.

A p-side electrode 109 is further formed on the p-type contact layer 108 and an n-side electrode 110 is formed on the bottom surface of the n-type GaAs substrate 101.

This semiconductor laser device can be fabricated in the following manner.

First, the n-type first cladding layer 102, the undoped active layer 103, the p-type second cladding layer 104 and the n-type current/light confinement layer 105 are sequentially grown on the n-type GaAs substrate 101 by performing a first MOCVD process.

Next, the stripe-shaped groove 106 is formed in the center portion of the current/light confinement layer 105 so as to reach the p-type second cladding layer 104; the p-type third cladding layer 107 is formed so as to bury this groove 106 by performing a second MOCVD process; and subsequently the p-type contact layer 108 is further grown thereon.

Thereafter, the p-side electrode 109 and the n-side electrode 110 are formed on the upper surface of the contact layer 108 and the bottom surface of the substrate 101, respectively. Then, the length of a cavity is adjusted to be 250 μm by a cleavage method, and an $Al_2O_3$ film is formed such that the reflectance at the end face of the cavity becomes 30%.

In the semiconductor laser device of the first example, the band gap of the current/light confinement layer 105 is equal to or smaller than that of the active layer 103. Thus, the light generated in the active layer 103 is absorbed by the current/light confinement layer 105, so that the light is confined mainly in the active layer 103 just under the stripe-shaped groove 106. In this semiconductor laser device, if a forward voltage is applied to the structure between the p-side electrode 109 and the n-side electrode 110, then a threshold current value becomes 40 mA and a slope efficiency of the current-optical output characteristics is 0.3 W/A.

Table 1 shows in comparison characteristic temperatures T0 and device lifetimes of the semiconductor laser device in the first example of the present invention and a conventional semiconductor laser device adopted as a comparative example. A characteristic temperature is calculated based on the equation to be described below with respect to a semiconductor laser device operating at room temperature (20° C.) and at a high temperature (80° C.). A device lifetime is measured when light of 5 mW is output at a high temperature of 80° C. The conventional semiconductor laser device is assumed to contain Se as a dopant for the current/light confinement layer 105.

TABLE 1

|  | Characteristic Temperature T0 | Device Lifetime |
|---|---|---|
| Example 1 | 180 K. | 10000 hours or more |
| Comparative Example | 140 K. | 3000 hours |

In Table 1, the characteristic temperature T0 is defined using a ratio of a threshold current value Ith(80° C.) at 80° C. to a threshold current value Ith(20° C.) at 20° C. based on the following Equation (1).

$$Ith(80° C.)/Ith(20° C.)=\exp\{(80° C.-20° C.)/T0\} \quad (1)$$

As T0 becomes higher, the ratio of Ith(80° C.) to Ith(20° C.) becomes more approximate to 1, so that the increase in the amount of current flowing through the device can be suppressed at a high temperature. On the other hand, the device lifetime is assumed to be a running time which it takes for the operational current of a semiconductor laser device to increase from the initial value by 20%.

As understood from Table 1, the semiconductor laser device in the first example of the present invention in which Si is used as a dopant for the n-type current/light confinement layer has a higher characteristic temperature and can suppress the increase in the amount of current flowing through the device operating at a high temperature more effectively as compared with a conventional semiconductor laser device using Se as a dopant. Thus, according to the present invention, the lifetime of the device operating at a high temperature can be increased threefold or more.

The reason why such results are obtained is considered to be as follows.

The characteristic temperature of a semiconductor laser device is varied depending upon the carrier density of the p-type second cladding layer 104. For example, when the carrier density of the p-type second cladding layer 104 is low, the barrier of the p-type second cladding layer 104 with respect to the carriers injected into the active layer 103 becomes low, so that the carriers leak into the p-type second cladding layer 104. Since such a carrier leakage becomes particularly remarkable at a high temperature, when the device operates at a high temperature, the amount of current flowing through the device is increased and the lifetime of the device is shortened. It has been confirmed based on experimental results that the carrier density in the p-type second cladding layer 104 is required to be set at $5 \times 10^{17}$ $cm^{-3}$ or more for preventing such a carrier leakage.

Figure 2:
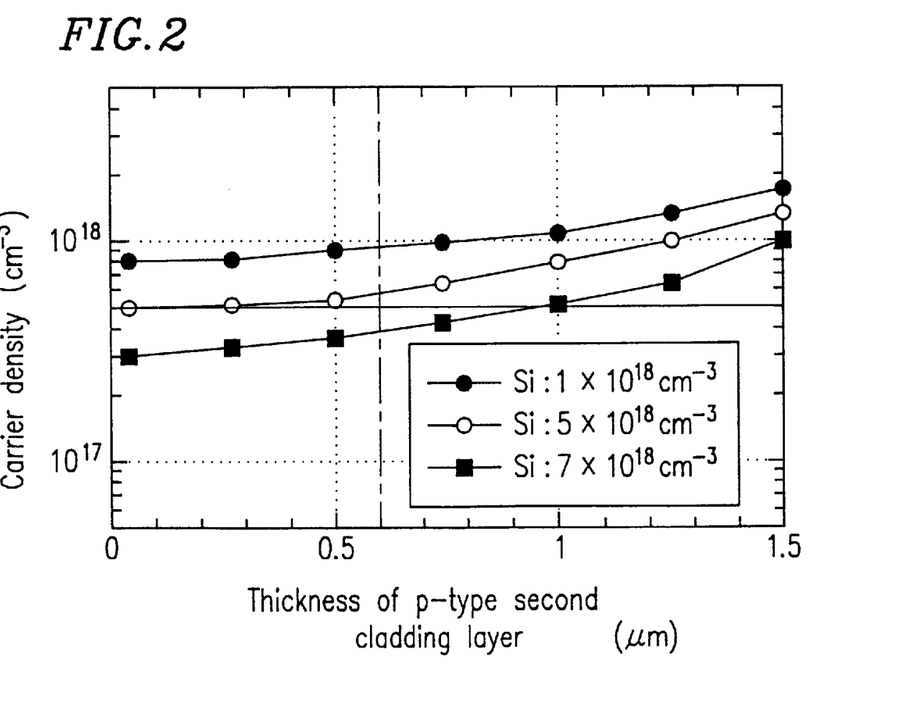
FIG. 2 is a graph showing a relationship between the carrier density and the film thickness of a p-type second cladding layer in the semiconductor laser device in the first example.

In fabricating such a semiconductor laser device, a relationship between the carrier density and the film thickness of the p-type second cladding layer 104 was measured while varying the carrier density of the n-type current/light confinement layer 105 after the first MOCVD process was finished. FIG. 2 shows the results of such a measurement performed for a semiconductor laser device in the first example of the present invention, while FIG. 9 shows the results of such a measurement performed for a conventional semiconductor laser device using Se as a dopant for the current/light confinement layer 105.

Figure 9:
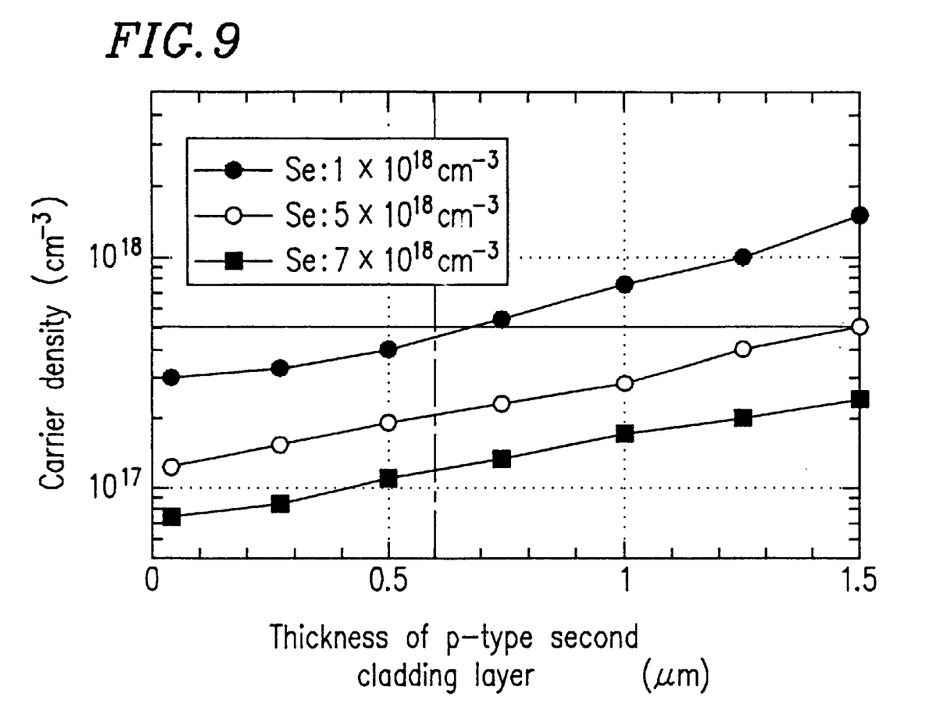
FIG. 9 is a graph showing a relationship between the carrier density and the film thickness of a p-type second cladding layer in a conventional semiconductor laser device.

As shown in FIG. 9, in the conventional semiconductor laser device, though the p-type second cladding layer is grown while setting the carrier density thereof at $2.0 \times 10^{18}$ $cm^{-3}$, the dopant Zn diffuses into both the side of the active layer and the n-type first cladding layer and the side of the n-type current/light confinement layer during the crystal growth, so that the carrier density of the p-type second cladding layer becomes lower.

As shown in FIG. 9, in the conventional semiconductor laser device, it is necessary to set the carrier density of the n-type current/light confinement layer containing the dopant Se to be less than $1 \times 10^{18}$ $cm^{-3}$ for setting the carrier density of the p-type second cladding layer to be $5 \times 10^{17}$ $cm^{-3}$ or more. However, in the case where the carrier density of the n-type current/light confinement layer is less than $1 \times 10^{18}$ $cm^{-3}$, the possibility that the carriers generated by the light absorbed by the n-type current/light confinement layer are recombined in the n-type current/light confinement layer is low. When the diffusion of the carriers generates an electrical potential, the current/light confinement layer is activated in the same way as a thyrister, so that the current cannot be confined any longer. Therefore, in a conventional semiconductor laser device, even if the carrier density of the n-type current/light confinement layer is set to be less than $1 \times 10^{18}$ $cm^{-3}$, the carrier density of the p-type second cladding layer cannot be set at $5 \times 10^{17}$ $cm^{-3}$ or more.

On the other hand, in the case where the carrier density of the n-type current/light confinement layer is equal to or more than $1 \times 10^{18}$ $cm^{-3}$, it is necessary to set the film thickness of the p-type second cladding layer to be larger than 0.6 μm for setting the carrier density of the p-type second cladding layer to be $5\times10^{17}$ cm$^{-3}$ or more. However, when the film thickness of the p-type second cladding layer is set to be larger than 0.6 μm, the possibility that the light emitted in the active layer reaches the n-type current/light confinement layer becomes small, so that the light cannot be confined. On the other hand, if the film thickness of the p-type second cladding layer is set to be smaller than 0.05 μm, the diffusion of the dopant from the n-type current/light confinement layer lowers the carrier density of the p-type second cladding layer, so that the current cannot be confined sufficiently.

Consequently, in a conventional semiconductor laser device, under the conditions where the carrier density of the n-type current/light confinement layer 105 is equal to or more than $1\times10^{18}$ cm$^{-3}$ and the film thickness of the p-type second cladding layer 104 is in an approximate range from 0.05 μm to 0.6 μm, both inclusive, the carrier density of the p-type second cladding layer 104 cannot be set at $5\times10^{17}$ cm$^{-3}$ or more.

Also, even if the carrier density of the p-type second cladding layer 104 is set at $2.0\times10^{18}$ cm$^{-3}$ or more, the diffusion amount of the dopant Zn is further increased, so that the carrier density of the p-type second cladding layer 104 cannot be set at $5\times10^{17}$ cm$^{-3}$ or more after the MOCVD process is finished.

Thus, in a conventional semiconductor laser device using Se as a dopant for the n-type current/light confinement layer, the carrier density of the p-type second cladding layer 104 cannot be set at $5\times10^{17}$ cm$^{-3}$ or more, while sufficiently confining current and light, so that the increase in the amount of current flowing through the device operating at a high temperature cannot be suppressed.

However, in the semiconductor laser device in the first example of the present invention, as shown in FIG. 2, though the carrier density of the p-type second cladding layer 104 is decreased during the crystal growth, the degree of the decrease is apparently smaller as compared with a conventional semiconductor laser device. This is because the diffusion of the dopant Zn from the p-type second cladding layer 104 into the adjacent layers can be suppressed by using Si as a dopant for the n-type current/light confinement layer 105.

In the semiconductor laser device in the first example of the present invention, it is necessary to set the carrier density of the n-type current/light confinement layer 105 containing the dopant Si to be $5\times10^{18}$ cm$^{-3}$ or less for setting the carrier density of the p-type second cladding layer 104 to be $5\times10^{17}$ cm$^{-3}$ or more. In addition, since the band gap of the n-type current/light confinement layer 105 is equal to or smaller than the band gap of the active layer 103, it is necessary to set the carrier density of the n-type current/light confinement layer 105 to be $1\times10^{18}$ cm$^{-3}$ or more for sufficiently confining the current. Furthermore, it is necessary to set the film thickness of the p-type second cladding layer 104 to be in an approximate range from 0.05 μm to 0.6 μm, both inclusive, for sufficiently confining current and light.

As shown in FIG. 2, in the semiconductor laser device in the first example of the present invention, under the conditions where the carrier density of the n-type current/light confinement layer 105 is in an approximate range from $1\times10^{18}$ cm$^{-3}$ to $5\times10^{18}$ cm$^{-3}$, both inclusive, and the film thickness of the p-type second cladding layer 104 is in an approximate range from 0.05 μm to 0.6 μm, both inclusive, the carrier density of the p-type second cladding layer 104 can be set at $5\times10^{17}$ cm$^{-3}$ or more.

Therefore, it is possible to reduce the amount of current flowing through the device operating at a high temperature and to make the lifetime of the device operating at a high temperature longer by suppressing the leakage of the carriers from the active layer 103 to the p-type second cladding layer 104 at a high temperature. In such a case, since the carrier density of the n-type current/light confinement layer 105 is sufficiently high, the carriers generated by the light absorbed by the n-type current/light confinement layer 105 can be recombined in the n-type current/light confinement layer 105, so that the current can be confined sufficiently. In addition, the film thickness of the p-type second cladding layer 104 is a thickness suitable for confining current and light.

Furthermore, in the semiconductor laser device in the first example of the present invention, not Si but Se is used as a dopant for the n-type first cladding layer 102 adjacent to the active layer 103. Even when the Se dopant diffuses from the n-type first cladding layer 102 to the active layer 103, the light emission efficiency is not degraded and it is possible to prevent the characteristics of the semiconductor laser device from being deteriorated.

EXAMPLE 2

Figure 3:
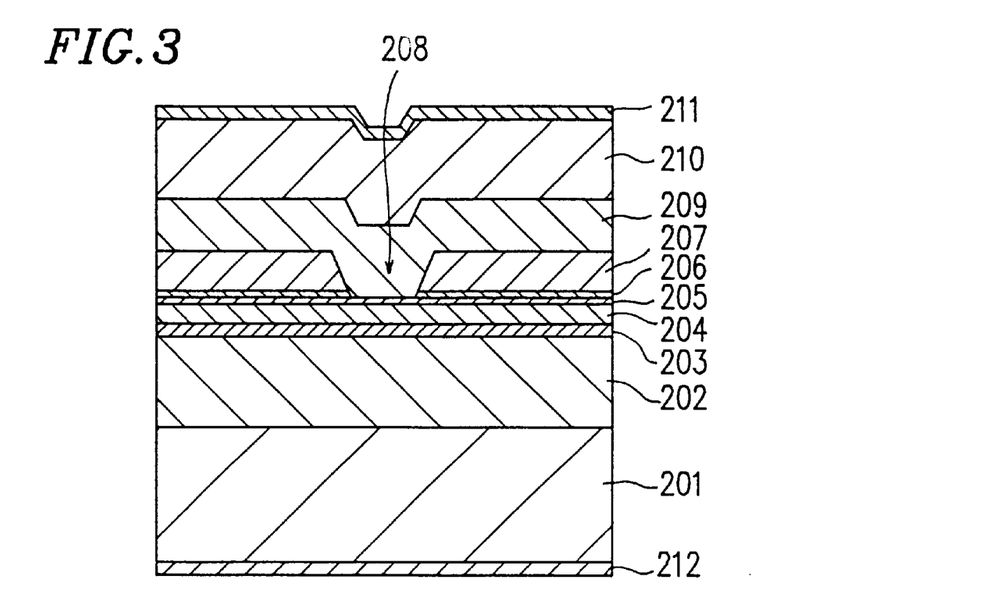
FIG. 3 is a cross-sectional view of a semiconductor laser device in a second example of the present invention.

FIG. 3 is a cross-sectional view of a semiconductor laser device in a second example of the present invention.

As shown in FIG. 3, in this semiconductor laser device, an n-type Al$_{0.6}$Ga$_{0.4}$As first cladding layer 202 (film thickness: 1.0 μm; carrier density: $1\times10^{18}$ cm$^{-3}$; dopant: Se); an undoped Al$_{0.14}$Ga$_{0.86}$A active layer 203 (film thickness: 0.06 μm); a p-type Al$_{0.6}$Ga$_{0.4}$As second cladding layer 204 (film thickness: 0.35 μm; carrier density: $8\times10^{17}$ cm$^{-3}$; dopant: Zn); a p-type GaAs first etch stop layer 205 (film thickness: 0.003 μm; carrier density: $8\times10^{17}$ cm$^{-3}$; dopant: Zn); a p-type Al$_{0.6}$Ga$_{0.4}$As second etch stop layer 206 (film thickness: 0.02 μm; carrier density: $8\times10^{17}$ cm$^{-3}$; dopant: Zn); and an n-type Al$_{0.1}$Ga$_{0.9}$As current/light confinement layer 207 (film thickness: 0.6 μm; carrier density: $2\times10^{18}$ cm$^{-3}$; dopant: Si) are sequentially grown on an n-type GaAs substrate 201.

A stripe-shaped groove 208 is formed in the center portion of the n-type current/light confinement layer 207 so as to reach the p-type first etch stop layer 205. A p-type Al$_{0.5}$Ga$_{0.5}$As third cladding layer 209 (film thickness: 1.5 μm) is formed so as to bury the groove 208, and a p-type GaAs contact layer 210 (film thickness: 1.5 μm) is formed thereon.

A p-side electrode 211 is further formed on the p-type contact layer 210 and an n-side electrode 212 is formed on the bottom surface of the n-type GaAs substrate 201.

This semiconductor laser device can be fabricated in the following manner.

First, the n-type first cladding layer 202, the undoped active layer 203, the p-type second cladding layer 204, the p-type first etch stop layer 205, the p-type second etch stop layer 206 and the n-type current/light confinement layer 207 are sequentially grown on the n-type GaAs substrate 201 by performing a first MOCVD process.

Next, the stripe-shaped groove 208 is formed in the center portion of the current/light confinement layer 207 using a first etchant so as to reach the p-type second etch stop layer 206; the stripe-shaped groove 208 is further deepened by using a second etchant so as to reach the p-type first etch stop layer 205; the p-type third cladding layer 209 is formed so as to bury this groove 208 by performing a second MOCVD process, a liquid phase epitaxy (LPE) or a molecular beam epitaxy (MBE); and subsequently, the p-type contact layer 210 is grown thereon.

Thereafter, the p-side electrode 211 and the n-side electrode 212 are formed on the upper surface of the contact layer 210 and the bottom surface of the substrate 201, respectively. Then, the length of a cavity is adjusted to be 200 μm by a cleavage method, and an Al$_2$O$_3$ film is formed such that the reflectance at the end face of the cavity becomes 30%.

In the same way as the semiconductor laser device in the first example, the semiconductor laser device in the second example of the present invention also has a higher characteristic temperature and can also suppress the increase in the current flowing through the device operating at a high temperature more efficiently, as compared with a conventional semiconductor laser device using Se as a dopant for the n-type current/light confinement layer, so that the lifetime of the device operating at a high temperature can be increased three-fold or more.

In addition, in this second example, since the first etch stop layer 205 and the second etch stop layer 206 are formed, it is possible to control the depth of the stripe-shaped groove 208 with high precision and to make the surface of the groove 208 of GaAs which is less likely to be oxidized. The film thicknesses of the first etch stop layer 205 and the second etch stop layer 206 can be sufficiently smaller than those of the p-type second cladding layer 204 and the n-type current/light confinement layer 207 which are adjacent to the layers 205 and 206, respectively. Thus, even when such etch stop layers are formed, the device characteristics are not adversely affected. Furthermore, an LPE method or an MBE method can be utilized in the second crystal growth process for burying the groove 208.

EXAMPLE 3

Figure 4:
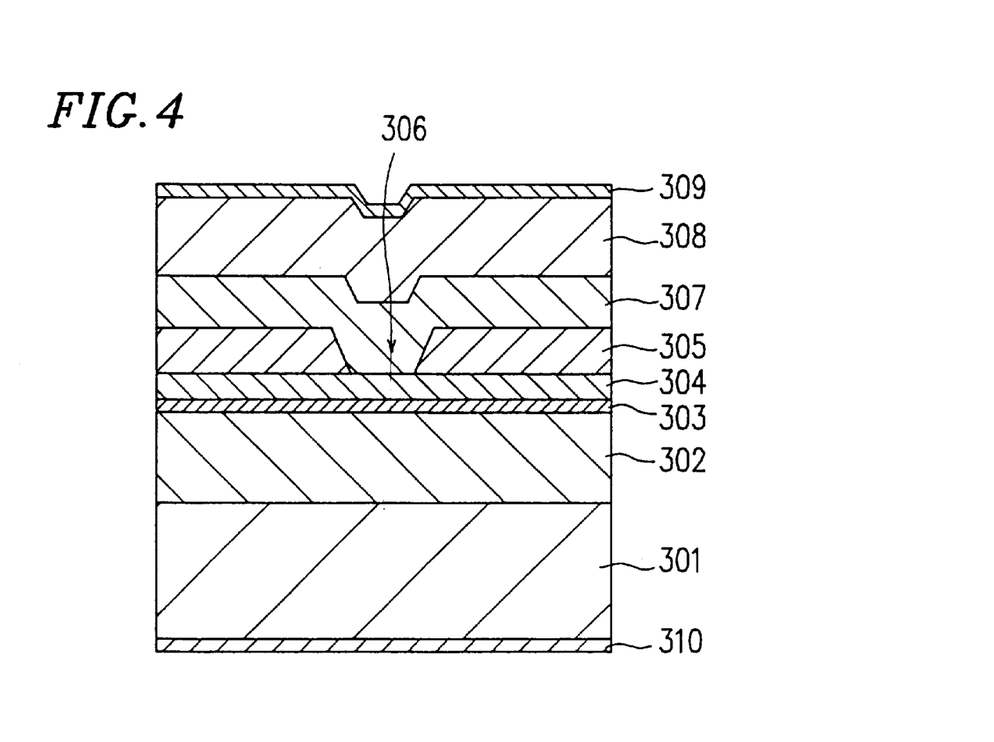
FIG. 4 is a cross-sectional view of a semiconductor laser device in a third example of the present invention.

FIG. 4 is a cross-sectional view of a semiconductor laser device in a third example of the present invention.

As shown in FIG. 4, in this semiconductor laser device, an n-type Al$_{0.5}$Ga$_{0.5}$As first cladding layer 302 (film thickness: 1.5 μm; carrier density: 7×10$^{17}$ cm$^{-3}$; dopant: Se); an undoped Al$_{0.14}$Ga$_{0.86}$As active layer 303 (film thickness: 0.05 μm); a p-type Al$_{0.5}$Ga$_{0.5}$As second cladding layer 304 (film thickness: 0.4 μm; carrier density: 1×10$_{18}$ cm$^{-3}$; dopant: Zn); and an n-type Al$_{0.7}$Ga$_{0.3}$As current/light confinement layer 305 (film thickness: 1.0 μm; carrier density: 7×10$^{17}$ cm$^{-3}$; dopant: Si) are sequentially grown on an n-type GaAs substrate 301.

A stripe-shaped groove 306 is formed in the center portion of the n-type current/light confinement layer 305 so as to reach the p-type second cladding layer 304. A p-type Al$_{0.5}$Ga$_{0.5}$As third cladding layer 307 (film thickness: 1.5 μm) is formed so as to bury the groove 306 and a p-type GaAs contact layer 308 (film thickness: 1.5 μm) is formed thereon.

A p-side electrode 309 is further formed on the p-type contact layer 308 and an n-side electrode 310 is formed on the bottom surface of the n-type GaAs substrate 301.

This semiconductor laser device can be fabricated in the following manner.

First, the n-type first cladding layer 302, the undoped active layer 303, the p-type second cladding layer 304 and the n-type current/light confinement layer 305 are sequentially grown on the n-type GaAs substrate 301 by performing a first MOCVD process.

Next, the stripe-shaped groove 306 is formed in the center portion of the current/light confinement layer 305 so as to reach the p-type second cladding layer 304; the p-type third cladding layer 307 is formed so as to bury this groove 306 by performing a second MOCVD process; and then the p-type contact layer 308 is further grown thereon.

Thereafter, the p-side electrode 309 and the n-side electrode 310 are formed on the upper surface of the contact layer 308 and the bottom surface of the substrate 301, respectively. Then, the length of a cavity is adjusted to be 375 μm by a cleavage method, and an Al$_2$O$_3$ film and a Si film are formed such that the reflectance at a light-emitting end face of the cavity becomes 12% and the reflectance at the opposite end face thereof becomes 75%.

In the semiconductor laser device of the third example, the band gap of the current/light confinement layer 305 is larger than that of the active layer 303. Thus, the light generated in the active layer 303 is not absorbed by the current/light confinement layer 305. In such a case, since the refractive index of the current/light confinement layer 305 is smaller than the refractive index of any of the adjacent layers, the difference in the refractive indices causes the light to be confined mainly in the active layer 303 just under the stripe-shaped groove 306. In this semiconductor laser device, if a forward voltage is applied to the structure between the p-side electrode 309 and the n-side electrode 310, then a threshold current value becomes 30 mA and a slope efficiency of the current-optical output characteristics is 0.80 W/A.

Table 2 shows in comparison characteristic temperatures T0 and device lifetimes of the semiconductor laser device in the third example of the present invention and a conventional semiconductor laser device adopted as a comparative example. A characteristic temperature is calculated based on the equation to be described below with respect to a semiconductor laser device operating at room temperature (20° C.) and at a high temperature (70° C.). A device lifetime is measured when light of 50 mW is output at a high temperature of 70° C. The conventional semiconductor laser device is assumed to contain Se as a dopant for the current/light confinement layer 305.

TABLE 2

|  | Characteristic Temperature T0 | Device Lifetime |
| --- | --- | --- |
| Example 3 | 170 K. | 5000 hours or more |
| Comparative Example | 130 K. | 1000 hours |

In Table 2, the characteristic temperature T0 is defined using a ratio of a threshold current value Ith(70° C.) at 70° C. to a threshold current value Ith(20° C.) at 20° C. based on the following Equation (2).

$$Ith(70° C.)/Ith(20° C.)=\exp\{(70° C.-20° C.)/T0\} \quad (2)$$

As T0 becomes higher, the ratio of Ith(70° C.) to Ith(20° C.) becomes more approximate to 1, so that the increase in the amount of current flowing through the device operating at a high temperature can be suppressed. On the other hand, the device lifetime is assumed to be a running time which it takes for the operational current of a semiconductor laser device to increase from the initial value by 20%.

As understood from Table 2, the semiconductor laser device in the third example of the present invention has a higher characteristic temperature and can suppress the increase in the amount of current flowing through the device at a high temperature more effectively as compared with a conventional semiconductor laser device using Se as a dopant for the n-type current/light confinement layer. Thus, according to the present invention, the lifetime of the device operating at a high temperature can be increased fivefold or more.

The reason why such results are obtained is considered to be as follows.

Figure 5:
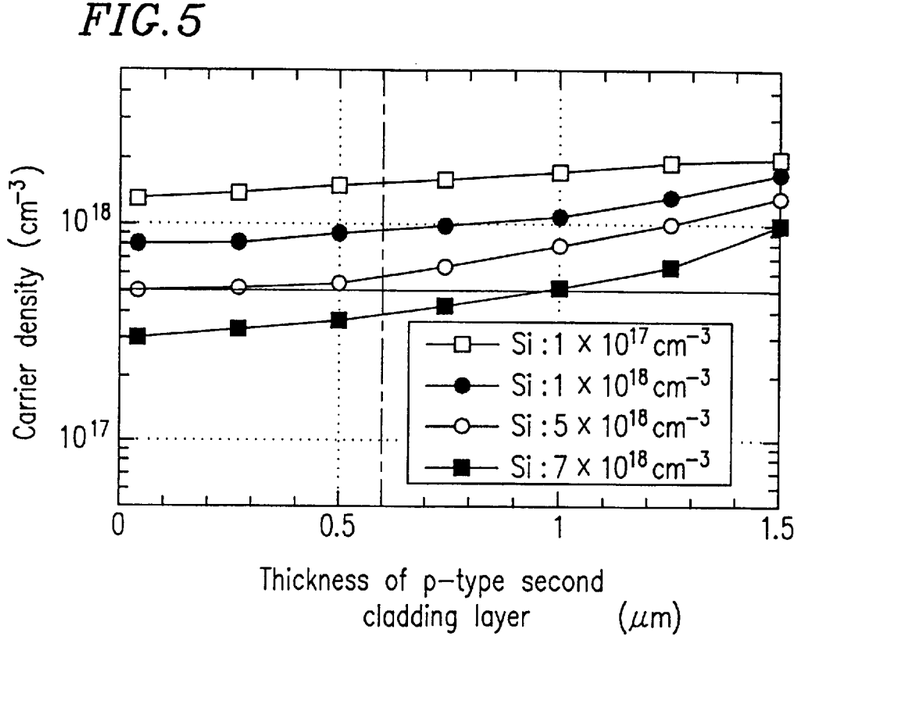
FIG. 5 is a graph showing a relationship between the carrier density and the film thickness of a p-type second cladding layer in the semiconductor laser device in the third example.

As described in the first example, the characteristic temperature of a semiconductor laser device is varied depending upon the carrier density of the p-type second cladding layer 304. FIG. 5 shows a relationship between the carrier density and the film thickness of the p-type second cladding layer 304 which was measured while varying the carrier density of the n-type current/light confinement layer 305 after the first MOCVD process was finished in fabricating the semiconductor laser device of the third example.

In the semiconductor laser device in the third example of the present invention, as shown in FIG. 5, though the carrier density of the p-type second cladding layer 304 is decreased during the crystal growth, the degree of the decrease is apparently smaller as compared with a conventional semiconductor laser device. This is because the diffusion of the dopant Zn of the p-type second cladding layer 304 into the adjacent layers can be suppressed by using Si as a dopant for the n-type current/light confinement layer 305.

In the semiconductor laser device in the third example of the present invention, it is necessary to set the carrier density of the n-type current/light confinement layer 305 containing the dopant Si to be $5 \times 10^{18}$ cm$^{-3}$ or less for setting the carrier density of the p-type second cladding layer 304 to be $5 \times 10^{17}$ cm$^{-3}$ or more. In addition, since the band gap of the n-type current/light confinement layer 305 is larger than the band gap of the active layer 303, the light generated in the active layer 303 is not absorbed by the n-type current/light confinement layer 305. Thus, in order to sufficiently confine the current, it is necessary to set the carrier density of the n-type current/light confinement layer 305 to be $1 \times 10^{17}$ cm$^{-3}$ or more. Furthermore, it is preferable to set the film thickness of the p-type second cladding layer 304 to be in an approximate range from 0.05 μm to 0.6 μm, both inclusive, for sufficiently confining current and light.

As shown in FIG. 5, in the semiconductor laser device in the third example of the present invention, under the conditions where the carrier density of the n-type current/light confinement layer 305 is in an approximate range from $1 \times 10^{17}$ cm$^{-3}$ to $5 \times 10^{18}$ cm$^{-3}$, both inclusive, and the film thickness of the p-type second cladding layer 304 is in an approximate range from 0.05 μm to 0.6 μm, both inclusive, the carrier density of the p-type second cladding layer 304 can be set at $5 \times 10^{17}$ cm$^{-3}$ or more.

Therefore, it is possible to reduce the amount of current flowing through the device operating at a high temperature and increase the lifetime of the device operating at a high temperature by suppressing the leakage of the carriers from the active layer 303 to the p-type second cladding layer 304 at a high temperature. In such a case, since the carrier density of the n-type current/light confinement layer 305 is sufficiently high, a sufficient amount of current can be confined. In addition, the film thickness of the p-type second cladding layer 304 is a thickness suitable for confining current and light.

Furthermore, in the semiconductor laser device in the third example of the present invention, not Si but Se is used as a dopant for the n-type first cladding layer 302 adjacent to the active layer 303. Even when the Se dopant diffuses from the n-type first cladding layer 302 to the active layer 303, the light emission efficiency is not degraded and it is possible to prevent the characteristics of the semiconductor laser device from being deteriorated.

EXAMPLE 4

Figure 6:
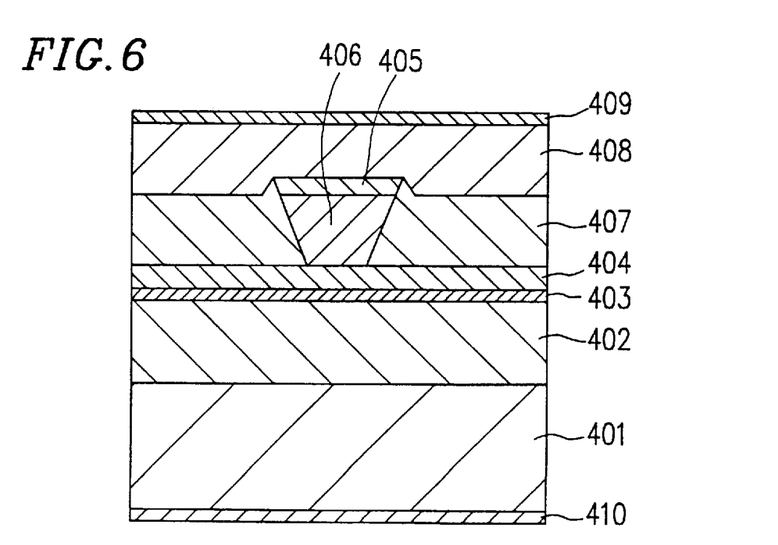
FIG. 6 is a cross-sectional view of a semiconductor laser device in a fourth example of the present invention.

FIG. 6 is a cross-sectional view of a semiconductor laser device in a fourth example of the present invention.

As shown in FIG. 6, in this semiconductor laser device, an n-type Al$_{0.5}$Ga$_{0.5}$As first cladding layer 402 (film thickness: 1.5 μm; carrier density: $1 \times 10^{18}$ cm$^{-3}$; dopant: S); an undoped multi-quantum well (MQW) AlGaAs active layer 403 (number of well layers: 3; thickness of each well layer: 0.01 μm; Al mole fraction in each well layer: 0.1; thickness of barrier layer: 0.008 μm; Al mole fraction in barrier layer: 0.35; thickness of guide layer: 0.02 μm; and Al mole fraction in guide layer: 0.35); and a p-type Al$_{0.5}$Ga$_{0.5}$As second cladding layer 404 (film thickness: 1.5 μm; carrier density: $6 \times 10^{17}$ cm$^{-3}$; dopant: Mg) are sequentially grown on an n-type GaAs substrate 401.

The p-type second cladding layer 404 has been etched so as to have a center portion in a ridge stripe shape and the thickness of the portions of the p-type second cladding layer 404 other than the ridge stripe-shaped portion is 0.20 μm. Hereinafter, the ridge stripe-shaped portion of the p-type second cladding layer 404 will be called a third cladding layer 406 and the flat portions other than the ridge stripe-shaped portion will be regarded as the p-type second cladding layer 404.

A p-type GaAs cap layer 405 (film thickness: 0.1 μm) is formed on the p-type third cladding layer 406, and an n-type GaAs current/light confinement layer 407 (film thickness: 0.5 μm; carrier density: $3.5 \times 10^{18}$ cm$^{-3}$; dopant: Si) is formed so as to sandwich both outer sides of the ridge stripe-shaped third cladding layer 406 and the p-type cap layer 405 and bury these layers therebetween.

A p-type GaAs contact layer 408 (film thickness: 1.5 μm) is formed so as to cover the entire surface of the substrate 401. A p-side electrode 409 is further formed on the p-type contact layer 408 and an n-side electrode 410 is formed on the bottom surface of the n-type GaAs substrate 401.

This semiconductor laser device can be fabricated in the following manner.

First, the n-type first cladding layer 402, the undoped MQW active layer 403, the p-type second cladding layer 404 and the p-type cap layer 405 are sequentially grown on the n-type GaAs substrate 401 by performing a first MOCVD process.

Next, an SiN film is formed in a stripe shape and the p-type second cladding layer 404 and the p-type cap layer 405 are etched by using the SiN film as a mask, thereby forming the p-type second cladding layer 404, the third cladding layer 406 in a ridge stripe shape and the p-type cap layer 405. In this case, the thickness of the remaining portions of the p-type second cladding layer 404 is set to be 0.2 μm.

Thereafter, while using the stripe-shaped SiN film as a mask, the n-type current/light confinement layer 407 is grown to bury both sides of the ridge stripe therebetween by performing a second MOCVD process.

Next, the SiN film is removed and the p-type contact layer 408 is formed so as to cover the entire surface of the substrate 401 by performing a third MOCVD process.

Thereafter, the p-side electrode 409 and the n-side electrode 410 are formed on the upper surface of the contact layer 408 and the bottom surface of the substrate 401, respectively. Then, the length of a cavity is adjusted to be 400 μm by a cleavage method, and an Al$_2$O$_3$ film and a Si film are formed such that the reflectance at a light-emitting end face of the cavity becomes 10% and the reflectance at the opposite end face thereof becomes 90%.

In the semiconductor laser device of the fourth example, the band gap of the current/light confinement layer 407 is equal to or smaller than that of the active layer 403. Thus, the light generated in the active layer 403 is absorbed by the current/light confinement layer 407, so that the light is confined mainly in the active layer 403 just under the ridge stripe. In this semiconductor laser device, if a forward voltage is applied to the structure between the p-side electrode 409 and the n-side electrode 410, then a threshold current value becomes 40 mA and a slope efficiency of the current-optical output characteristics is 0.6 W/A.

Table 3 shows in comparison characteristic temperatures T0 and device lifetimes of the semiconductor laser device in the fourth example of the present invention and a conventional semiconductor laser device adopted as a comparative example. A characteristic temperature is calculated based on the equation to be described below with respect to a semiconductor laser device operating at room temperature (20° C.) and at a high temperature (70° C.). A device lifetime is measured when light of 50 mW is output at a high temperature of 70° C. The conventional semiconductor laser device is assumed to contain Se as a dopant for the current/light confinement layer 407.

TABLE 3

| | Characteristic Temperature T0 | Device Lifetime |
|---|---|---|
| Example 4 | 170 K. | 5000 hours or more |
| Comparative Example | 130 K. | 1000 hours |

In Table 3, the characteristic temperature T0 is defined using a ratio of a threshold current value Ith(70° C.) at 70° C. to a threshold current value Ith(20° C.) at 20° C. based on the following Equation (3).

$$Ith(70° C.)/Ith(20° C.)=exp\{(70° C.-20° C.)/T0\} \quad (3)$$

As T0 becomes higher, the ratio of Ith(70° C.) to Ith(20° C.) becomes more approximate to 1, so that the increase in the amount of current flowing through the device operating at a high temperature can be suppressed. On the other hand, the device lifetime is assumed to be a running time which it takes for the operational current of a semiconductor laser device to increase from the initial value by 20%.

As understood from Table 3, the semiconductor laser device in the fourth example of the present invention has a higher characteristic temperature and can suppress the increase in the amount of current flowing through the device at a high temperature more effectively as compared with a conventional semiconductor laser device. Thus, according to the present invention, the lifetime of the device operating at a high temperature can be increased fivefold or more.

The reason why such results are obtained is considered to be as follows.

Figure 7:
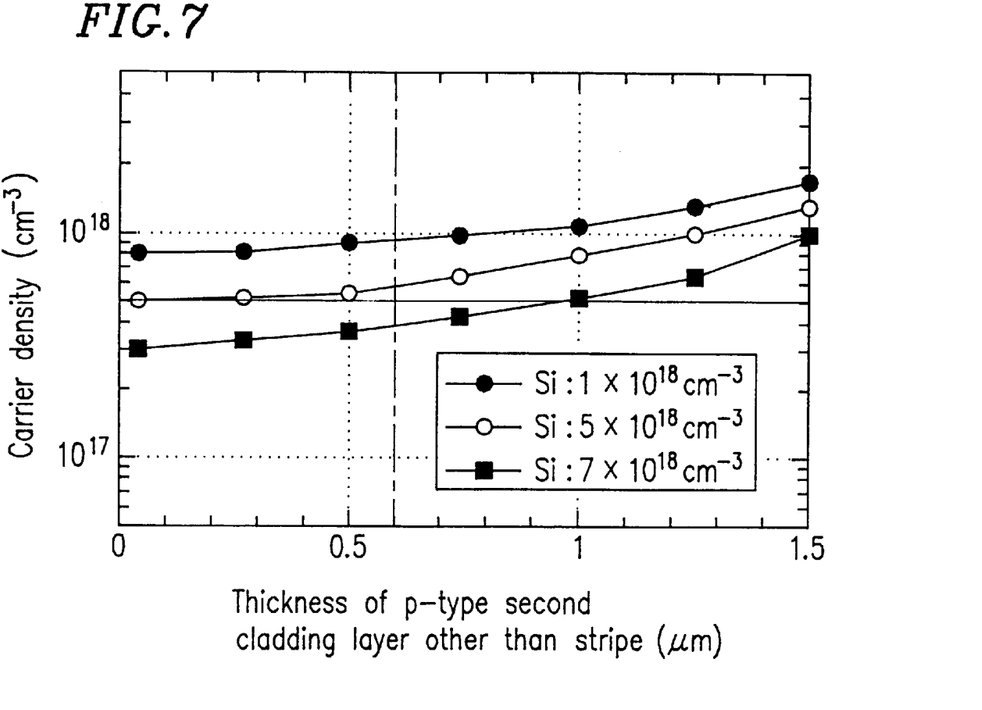
FIG. 7 is a graph showing a relationship between the carrier density and the film thickness of a p-type second cladding layer in the semiconductor laser device in the fourth example.

As described in the first example, the characteristic temperature of a semiconductor laser device is varied depending upon the carrier density of the p-type second cladding layer 404. FIG. 7 shows a relationship between the carrier density and the film thickness of the p-type second cladding layer 404 which was measured while varying the carrier density of the n-type current/light confinement layer 407 after the second MOCVD process was finished in fabricating the semiconductor laser device of the fourth example.

In the semiconductor laser device in the fourth example of the present invention, as shown in FIG. 7, though the carrier density of the p-type second cladding layer 404 is decreased during the crystal growth, the degree of the decrease is apparently smaller as compared with a conventional semiconductor laser device. This is because the diffusion of the dopant Mg of the p-type second cladding layer 404 into the adjacent layers can be suppressed by using Si as a dopant for the n-type current/light confinement layer 407.

In the semiconductor laser device in the fourth example of the present invention, it is necessary to set the carrier density of the n-type current/light confinement layer 407 containing the dopant Si to be $5 \times 10^{18}$ cm$^{-3}$ or less for setting the carrier density of the p-type second cladding layer 404 to be $5 \times 10^{17}$ cm$^{-3}$ or more. In addition, since the band gap of the n-type current/light confinement layer 407 is equal to or smaller than the band gap of the active layer 403, it is necessary to set the carrier density of the n-type current/light confinement layer 407 to be $1 \times 10^{18}$ cm$^{-3}$ or more for sufficiently confining the current. Furthermore, it is preferable to set the film thickness of the p-type second cladding layer 404 (or the portions other than the ridge stripe portion) to be in an approximate range from 0.05 μm to 0.6 μm, both inclusive, for sufficiently confining current and light.

As shown in FIG. 7, in the semiconductor laser device in the fourth example of the present invention, under the conditions where the carrier density of the n-type current/light confinement layer 407 is in an approximate range from $1 \times 10^{17}$ cm$^{-3}$ to $5 \times 10^{18}$ cm$^{-3}$, both inclusive, and the film thickness of the p-type second cladding layer 404 is in an approximate range from 0.05 μm to 0.6 μm, both inclusive, the carrier density of the p-type second cladding layer 404 can be set at $5 \times 10^{17}$ cm$^{-3}$ or more.

Therefore, it is possible to reduce the amount of current flowing through the device operating at a high temperature and increase the lifetime of the device operating at a high temperature by suppressing the leakage of the carriers from the active layer 403 to the p-type second cladding layer 404 at a high temperature. In such a case, since the carrier density of the n-type current/light confinement layer 407 is sufficiently high, a sufficient amount of current can be confined. In addition, the film thickness of the p-type second cladding layer 404 (or the portions other than the ridge stripe portion) is a thickness suitable for confining current and light.

Furthermore, in the semiconductor laser device in the fourth example of the present invention, not Si but S is used as a dopant for the n-type first cladding layer 402 adjacent to the active layer 403. Even when the S dopant diffuses from the n-type first cladding layer 402 to the active layer 403, the light emission efficiency is not degraded and it is possible to prevent the characteristics of the semiconductor laser device from being deteriorated.

The present invention has been described as being applied to the above-described preferred embodiments. However, it is not intended that the present invention is limited to these embodiments.

The film thicknesses, the Al mole fractions and the carrier densities of the respective semiconductor layers may be set at different values from those specified in the foregoing examples.

In addition, any crystal growth method other than the MOCVD method, e.g., an MBE method, an LPE method, a metalorganic molecular beam epitaxy (MOMBE) method or an atomic layer epitaxy (ALE) method, may also be used.

Moreover, Zn or Mg may be used as a p-type dopant and any Group VI atom (such as Se, S or Te) other than Si may also be used as an n-type dopant contained in the first cladding layer.

In the foregoing examples, the present invention is applied to AlGaAs/GaAs type materials. However, the present invention is applicable to any other materials such as AlGaInP/GaAs type materials.

As is apparent from the foregoing description, according to the present invention, by using Si as a dopant for an n-type current/light confinement layer, it is possible to suppress the dopant of the p-type cladding layers from diffusing during the crystal growth of the n-type first cladding layer, the active layer, the p-type second cladding layer and the n-type current/light confinement layer on the n-type substrate. Since the decrease in the carrier density of the p-type cladding layer can be prevented, it is possible to prevent the carriers from leaking from the active layer into the p-type cladding layer while holding the barrier of the p-type cladding layer to be sufficiently high with respect to the active layer. The remarkable increase in the amount of current flowing through the device operating at a high temperature can be suppressed, so that the lifetime of the device operating at a high temperature can be increased.

Moreover, since Si is not used as a dopant for the n-type first cladding layer adjacent to the active layer, even when the dopant of the n-type first cladding layer diffuses into the active layer, the light emission efficiency is not degraded and the deterioration of the device characteristics resulting from such a degradation can be prevented.

Particularly when the thickness of the p-type second cladding layer is set in an approximate range from 0.05 μm to 0.6 μm, both inclusive, current and light can be efficiently confined.

In the case where the band gap of the n-type current/light confinement layer is set to be equal to or smaller than the band gap of the active layer and the carrier density of the current/light confinement layer is set in an approximate range from $1\times10^{18}$ cm$^{-3}$ to $5\times10^{18}$ cm$^{-3}$, both inclusive, or in the case where the band gap of the n-type current/light confinement layer is set to be larger than the band gap of the active layer and the carrier density of the current/light confinement layer is set in an approximate range from $1\times10^{17}$ cm$^{-3}$ to $5\times10^{18}$ cm$^{-3}$, both inclusive, not only current and light can be sufficiently confined but also the carrier density of the p-type second cladding layer can be sufficiently increased.

If a Group VI atom such as Se, S or Te is used as a dopant for the first cladding layer, the light emission efficiency is not degraded, so that it is possible to prevent the device characteristics from being deteriorated.

A semiconductor laser device having such satisfactory characteristics is suitably applicable to an optical disk or the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device comprising: an n-type semiconductor and a semiconductor multi-layer structure formed on the n-type semiconductor,
    the semiconductor multi-layer structure comprising:
        an active layer;
        an n-type first cladding layer and a p-type second cladding layer which are disposed so as to sandwich the active layer therebetween;
        an n-type current/light confinement layer having a strip-shaped groove portion for injecting a current into a selected region of the active layer; and
        a p-type third cladding layer formed so as to bury the stripe-shaped groove portion of the n-type current/light confinement layer,
    wherein the current/light confinement layer contains Si as a dopant, the n-type first cladding layer contains substantially no Si as a dopant, and the n-type first cladding layer, the active layer and the p-type second cladding layer are formed of AlGaAs semiconductor, and
    wherein the p-type second cladding layer is located between the active layer and the n-type current/light confinement layer, the p-type second cladding layer having a carrier concentration of at least $5\times10^{17}$ cm$^{-3}$.

2. A semiconductor laser device according to claim 1, wherein a thickness of the second cladding layer is in an approximate range from 0.05 μm to 0.6 μm, both inclusive.

3. A semiconductor laser device according to claim 1, wherein a band gap of the current/light confinement layer is equal to or smaller than a band gap of the active layer and a carrier density of the current/light confinement layer is in an approximate range from $1\times10^{18}$ cm$^{-3}$ to $5\times10^{18}$ cm$^{-3}$, both inclusive.

4. A semiconductor laser device according to claim 1, wherein a band gap of the current/light confinement layer is larger than a band gap of the active layer and a carrier density of the current/light confinement layer is in an approximate range from $1\times10^{17}$ cm$^{-3}$ to $5\times10^{18}$ cm$^{-3}$, both inclusive.

5. A semiconductor laser device according to claim 1, wherein a dopant of the first cladding layer is a Group VI atom.

6. A semiconductor laser device according to claim 1, wherein at least one etch stop layer is disposed under the current/light confinement layer.

7. A semiconductor laser device comprising: an n-type semiconductor and a semiconductor multi-layer structure formed on the n-type semiconductor,
    the semiconductor multi-layer structure comprising:
        an active layer;
        an n-type first cladding layer and a p-type second cladding layer which are disposed so as to sandwich the active layer therebetween;
        an n-type current/light confinement layer formed on the p-type second cladding layer, wherein the n-type current/light confinement layer has a strip-shaped groove portion for directing a current into a selected region of the active layer; and
        a p-type third cladding layer formed at least to bury the selected region defined by the stripe-shaped groove portion of the n-type current/light confinement layer,
    wherein the current/light confinement layer contains Si as a dopant, the n-type first cladding layer contains substantially no Si as a dopant, and the n-type first cladding layer, the active layer and the p-type second cladding layer are formed of AlGaAs semiconductor,
    wherein the p-type second cladding layer is located between the active layer and the n-type current/light confinement layer, the p-type second cladding layer having a carrier concentration of at least $5\times10^{17}$ cm$^{-3}$.

8. A semiconductor laser device according to claim 7, wherein the p-type third cladding layer further comprises a portion which covers an upper surface of the n-type current/light confinement layer.

9. A semiconductor laser device according to claim 7, wherein the p-type third cladding layer has a ridge stripe shape corresponding to the stripe-shaped groove of the n-type current/light confinement layer.

10. A semiconductor laser device according to claim 9, wherein the second cladding layer has a thickness in a range between a first value of about 0.05 μm and a second value of about 0.06 μm, said range including the first value and the second value.

11. A semiconductor laser device according to claim 9, wherein the current/light confinement layer has a first band gap, the active layer has a second band gap, the first band gap is less than or equal to the second band gap, and the current/light confinement layer has a carrier density in a range between a first value of about $1\times10^{18}$ cm$^{-3}$, and a second value of about $5\times10^{18}$ cm$^{-3}$, said range including the first value and the second value.

12. A semiconductor laser device according to claim 9, wherein the current/light confinement layer has a first band gap, the active layer has a second band gap, the first band gap is larger than the second band gap, and the current/light confinement layer has a carrier density between a first value of about $1\times10^{17}$ cm$^{-3}$ and a second value of about $5\times10^{18}$ cm$^{-3}$, said range including the first value and the second value.

13. A semiconductor laser device according to claim 9, wherein the first cladding layer contains a dopant comprising a Group VI atom.

14. A semiconductor, laser device comprising:

an n-type semiconductor and a semiconductor multi-layer structure formed on the n-type semiconductor, the semiconductor multi-layer structure comprising:

an active layer;

an n-type first cladding layer and a p-type second cladding layer which are disposed so as to sandwich the active layer therebetween;

an n-type current/light confinement layer formed on the p-type second cladding layer, wherein the n-type current/light confinement layer has a strip-shaped groove portion for directing a current into a selected region of the active layer; and a p-type third cladding layer formed to bury the selected region defined by the strip-shaped groove portion of the n-type current/light confinement layer, wherein the current/light confinement layer which is not in contact with the active layer contains Si as a dopant, and the n-type first cladding layer which is in contact with the active layer contains substantially no Si as a dopant, wherein the p-type first cladding layer, the active layer and the p-type second cladding layer are formed of AlGaAs semiconductor, wherein the p-type second cladding layer is located between the active layer and the n-type current/light confinement laye, the p-type second cladding layer having a carrier concentration of at least $5\times10^{17}$ cm$^{-3}$, and wherein the semiconductor multi-layer structure is formed of a III-V semiconductor.

* * * * *